United States Patent [19]
Kober et al.

[11] 4,100,670
[45] Jul. 18, 1978

[54] IC INSERTION TOOL

[75] Inventors: Marvin Kober, Spring Valley, N.Y.; Jarda Dvorak, Ringwood, N.J.

[73] Assignee: OK Machine & Tool Corp., New York, N.Y.

[21] Appl. No.: 813,270

[22] Filed: Jul. 6, 1977

[51] Int. Cl.² .............................................. H05K 3/32
[52] U.S. Cl. ..................................... 29/564.1; 29/740; 29/741; 29/758; 140/147
[58] Field of Search ................. 29/741, 739, 740, 758, 29/764, 564.1, 626; 140/147

[56] References Cited
U.S. PATENT DOCUMENTS 3,535,763 10/1970 Helton .................................... 29/741
3,538,580 11/1970 Bruner .............................. 29/764 X Primary Examiner—Carl E. Hall

[57] ABSTRACT

An IC insertion tool comprises a handle having an IC gripping end for holding an IC during insertion into a socket. As the IC pins enter the socket, the gripping end retracts automatically ejecting the IC. As a further feature, a pin straightner is mounted in the handle. The pin straightener is provided with an ejecting bar operatively connected to the retractable gripping end.

8 Claims, 5 Drawing Figures

IC INSERTION TOOL

This invention relates to electrical component insertion tools, and in particular to integrated circuit (IC) insertion tools.

Electrical components of the integrated circuit (IC) or hybrid circuit type are conventionally packaged in plastic or ceramic housings with multiple external pins arranged in parallel rows to provide access to the internal circuitry. Typical packages contain 14, 16 or 24 pins in two rows and are known in the art as dual-in-line packages, such as the TO-116. The IC in use is plugged into a socket. Tools are known in the art that function to grip the IC, and that can then be employed to insert the IC into its socket, by the user positioning the tool-held IC over the socket, and then operating a plunger while pressing the insertion tool onto the socket. This causes the IC pins to enter the socket holes while the IC is simultaneously ejected from the insertion tool. The tool is extremely useful because it is difficult by hand gripping alone to insert a multi-pinned IC into its socket without bending out of alignment the fragile pins of the IC.

A disadvantage of the known tools is that two separate actions are required to complete a proper insertion; first, pushing down on the tool, and, second, operating the plunger, usually with the user's thumb or palm. Still further, should the IC pins be out of line, they have to be carefully adjusted by hand back into alignment position with the socket holes. This is cumbersome and time consuming.

A principal object of the invention is a novel IC insertion tool requiring only a single action for insertion of an IC into its socket and ejection of the IC from the tool.

A further object of the invention is a novel IC insertion tool capable of low-cost manufacture.

Still another object of the invention is an IC insertion tool incorporating a pin straightener which is readily employed to correct IC pin misalignment before inserting same into a socket.

These and further objects of the invention are realized, briefly speaking, with a novel IC insertion tool having an elongated hangle portion shaped for easy gripping by the fingers of the user. At one end of the handle are located projecting gripping members forming a cavity having a width adapted to receive in a snug manner the IC. The bottom of the cavity is formed by a fixed stop block. The projecting gripping members are spring-loaded into their downward or furthest projecting position, but they can retract into the housing under pressure. When pressed against a socket, the pins of an IC held in the tool of the invention is forced into the socket holes while simultaneously the gripping members retract causing self-ejection of the IC from the tool.

As a further feature of the invention, a novel pin straightener is mounted in the handle for straightening and aligning the IC pins in preparation for insertion into a socket. Means are provided for ejecting the IC from the pin straightener, by coupling the IC gripping members to an ejection bar in the pin straightener such that pressing of the gripping members on any hard surface causes actuation of the ejection bar and ejection of an IC inserted into the pin straightener.

The insertion tool will now be described in greater detail with reference to the accompanying drawings, wherein.

Figure 1:
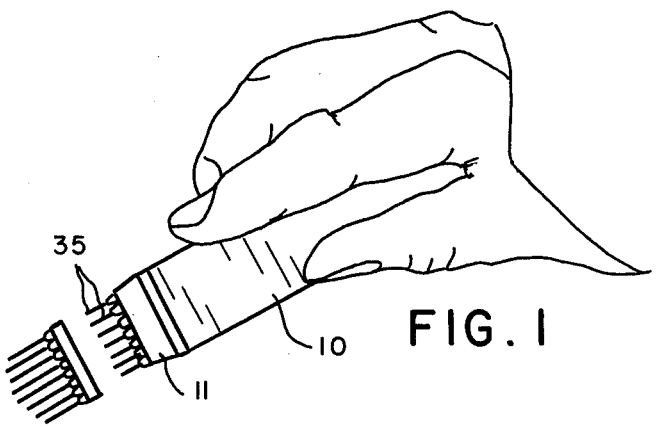
FIG. 1 is a view illustrating use of one form of insertion tool in accordance with the invention for inserting a gripped IC into a socket.
Figure 2:
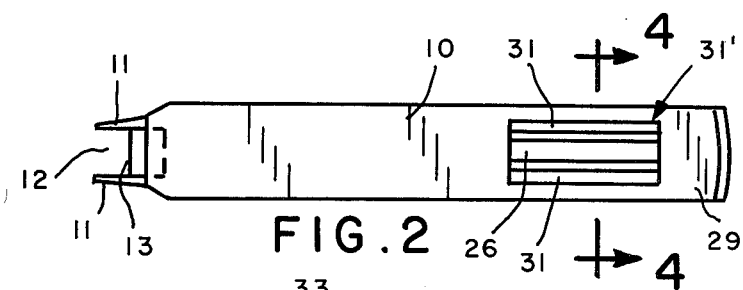
FIG. 2 is a front view of the tool of the invention shown in FIG. 1.
Figure 4:
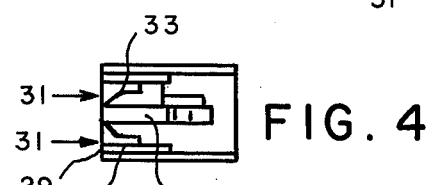
FIG. 4 is a cross-sectional view along the line 4—4 of FIG. 2.

The drawings illustrate one form of insertion tool in accordance with the invention comprising an elongated handle 10, generally rectangular in cross-section, and having at one end means for gripping an IC. In the illustrated embodiment, the gripping means comprises a pair of spaced parallel forwardly-projecting tapered members 11, defining an open ended cavity 12. The cavity 12 has a length dimension, into the plane of the drawing of FIG. 2, approximately that of the IC, though a substantial length difference is no handicap provided that all pins of the IC are contained within the cavity 12. The bottom of the cavity is defined by a fixed stop block 13, i.e., it is connected to the handle. The gripping members 11, however, are slideably mounted in the handle and can retract into the housing. The slideable action is really obtained by configuring the handle body, which may be of plastic or metal, to form a channel 15 along which the members 11 may slide. The construction is such that the gripping members 11 can retract inwardly until their distal ends are flush with the outer surface of the stop 13.

Figure 3:
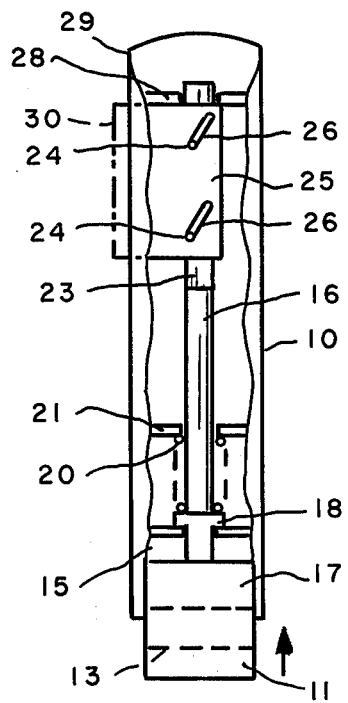
FIG. 3 is a side view of the tool of FIG. 1 with the cover broken away to show the interior construction.

The gripping members 11 are biased or spring-loaded into their outwardmost projecting position, which may be accomplished in any conventional manner. A preferred way is illustrated in FIG. 3, and is realized by providing a drive rod 16 connected to the gripping members 11, formed as the arms of a U-shaped element 17. The drive rod is provided with an enlarged shoulder 18, and the handle is configured to allow upward movement (FIG. 3) of the combined gripping member 11 and rod 16. The handle also has a space to receive a compression spring 20 which encircles the rod 16, and whose top end is constrained by the fixed handle wall 21, and whose bottom end is constrained by the shoulder 18. The compressed spring thus forces the gripping members 11 into their downward-most position.

The upper end of the drive rod 16 is cut away to form a flat 23 from which extend pins 24. An ejecting bar or plate 25 is disposed on the flat 23 and is provided with obloque slots 26 which receive the pins 24. The bar 25 abuts against a wall 28 of the handle preventing upward motion of the bar. When the rod 16 is driven upward, the pins 24 cam the bar 25 transversely to the longitudinal axis handle, that is, to the left in FIG. 3. The dimensions of the bar 25 are such that the left edge of the ejecting bar 25 is normally flush with the side surface 29 of the handle. When the gripping members 11 retract, the ejecting bar moves outwardly a small distance, shown in phantom in FIG. 3 at 30.

The ejecting bar 25 is part of a pin straightener 31' mounted in the handle. The pin straightener is designed for the dual rows of IC pins, and comprises on opposite sides of the ejecting bar 25, slots 31 whose long dimension is adequate to receive a full row of IC pins. The slots 31 are each defined by an outer transverse wall 32 and an inner curved wall 33, the slot spacing at the slot bottom corresponding to the correct spacing between the rows of socket holes or slightly larger. The narrower slot spacing at the surface 29 is to accommodate IC pins that are bent too far inwardly. The curved walls 33 form a generally arcuate surface over which the IC can be rocked back and forth. The back and forth rocking action greatly improves the straightening action. While the IC pins are fragile, they do have some spring tension, and the rocking action, it has been found, ensures that the elastic limit of the pins is exceeded and thus the pins remain spaced apart by the desired slot bottom dimension after removal from the straightener.

Figure 5:
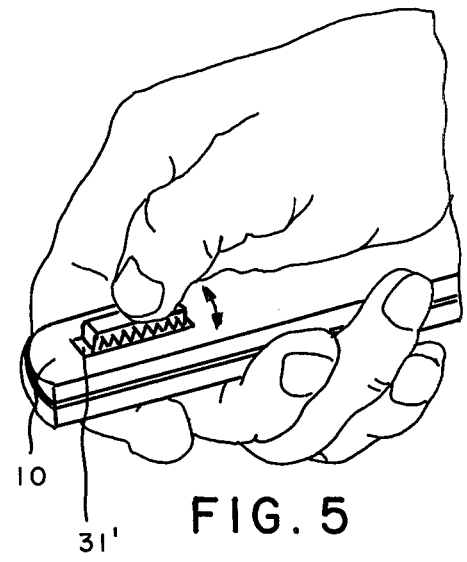
FIG. 5 is an enlarged perspective view of the pin straightener showing it in use.

In operation, the IC is first placed in the pin straightener 31' and rocked back and forth several times (FIG. 5). Then the gripping end of the tool is pressed against a hard surface causing retraction of the gripping members 11, and actuation of the ejecting bar 25 ejecting the IC from the straightener. Then the pins are visually examined, and any pins displaced in the row direction are carefully repositioned by hand. Next the IC is fitted into cavity 12 of the gripping means, and pushed inward until resistance is met. This also may be accomplished by placing the IC on a table, standing it on its pins, locating the tool over the IC and pushing down on the IC with the tool. The gripping member spacing 11 is such that the IC fits snugly in the cavity with the pin sides squeezed between the gripping members. The IC pins, shown at 35, will protrude forwardly beyond the forward edge of the gripping members. The tool handle held within the user's hand, like a pencil, is then used to position the protruding pins over and into the socket holes. When all pins have entered, the tool is moved forwardly until the forward edges of the gripping members 11 strike the socket. As the hand pressure is increased, the gripping members retract until the IC lid strikes the stop 13, preventing further rearward movement. Further pressure causes further retraction of the gripping members 11 until the IC pins have been fully inserted into the socket holes and the IC package bottoms on the socket. Simultaneously, the retracting gripping members has forced or gradually ejected the IC from between the gripping members, and when the IC is fully seated in the socket, it is free of or just slightly held by the gripping members, and thus the tool can be readily removed without disturbing the socketed IC.

As will be evident from the foregoing, a relatively simple, sturdy, low cost tool results capable of easy use for inserting an IC into a socket. This is accomplished with only a single stroke or single action, since retraction of the gripping members automatically causes ejection of the IC from between the gripping members. The tool also offers the advantage of a built-in pin straightener, also provided with an IC ejector operatively connected to the gripping members, which lends itself to ready use.

The tool of the invention is applicable not only to dual-in-line ICs, but also to any multi-pinned electrical component that requires the assistance of tool holding to facilitate insertion into a socket.

While my invention has been described in connection with specific embodiments thereof, those skilled in the art will recognize that various modifications are possible within the principles enunciated herein and thus the present invention is not to be limited to the specific embodiments disclosed.

What is claimed is:

1. An insertion tool comprising a handle portion having an electrical component gripping end, said gripping end comprising means for gripping the sides of the electrical component and forming a cavity for receiving the gripped electrical component and for restraining rearward movement of the gripped component, and means for biasing the gripping means into a forwardly-projecting position, said gripping means being retractable within the handle when pressure is applied overcoming the biasing means, whereby retraction of the gripping means causes ejection of the electrical component from its receiving cavity.

2. An insertion tool as claimed in claim 1, wherein the electrical component is an IC having multiple pins.

3. An insertion tool as claimed in claim 2 wherein the gripping means comprises a pair of opposed gripping members projecting forwardly from the tool end and slideably mounted within the handle, and said rearward movement restraining means comprises a stop block defining the bottom of the cavity.

4. An insertion tool as claimed in claim 3, wherein the biasing means comprises spring-loading for the gripping members.

5. An insertion tool as claimed in claim 2, and further comprising mounted on the handle a pin straightener for the IC pins.

6. An insertion tool as claimed in claim 5, wherein said pin straightener comprises ejection means for the IC, and means operatively connecting the ejection means of the pin straightener to the retractable gripping means.

7. An insertion tool as claimed in claim 6, wherein the operative connection comprises an ejection bar slideably mounted in the handle, and means connected to the gripping means for camming the ejection bar outwardly upon retraction of the gripping means.

8. An insertion tool as claimed in claim 6, wherein the IC is a dual-in-line package, and the pin straightener comprises slots in the handle spaced apart to receive the dual rows of IC pins, the slots being each defined by an inner curved wall onto which the IC can be rocked back and forth until the pin rows attain a desired spacing.

* * * * *